(12) United States Patent
Studer et al.

(10) Patent No.: US 8,636,022 B2
(45) Date of Patent: Jan. 28, 2014

(54) PRODUCTION OF MICROFLUIDIC POLYMERIC DEVICES BY PHOTO-ASSISTED AND/OR THERMALLY ASSISTED PRINTING

(75) Inventors: Vincent Studer, Paris (FR); Denis Bartolo, Paris (FR); Guillaume Degre, Paris (FR)

(73) Assignees: Centre National de la Recherche Scientifique (CNRS), Paris (FR); Universite Pierre et Marie Curie (Paris 6), Paris (FR)

( * ) Notice: Subject to any disclaimer, the term of this patent is extended or adjusted under 35 U.S.C. 154(b) by 1212 days.

(21) Appl. No.: 12/374,180

(22) PCT Filed: Jul. 16, 2007

(86) PCT No.: PCT/FR2007/001212
§ 371 (c)(1),
(2), (4) Date: Jun. 3, 2009

(87) PCT Pub. No.: WO2008/009803
PCT Pub. Date: Jan. 24, 2008

(65) Prior Publication Data
US 2009/0250130 A1 Oct. 8, 2009

(30) Foreign Application Priority Data

Jul. 17, 2006 (FR) .................................. 06 06457

(51) Int. Cl.
*B81B 7/00* (2006.01)
*B29C 35/08* (2006.01)
*B32B 9/04* (2006.01)

(52) U.S. Cl.
USPC .................... 137/15.18; 137/315.01; 137/833; 264/492; 264/494

(58) Field of Classification Search
USPC .............. 137/1, 15.18, 833, 315.01; 264/494, 264/492; 428/411.1
See application file for complete search history.

(56) References Cited

U.S. PATENT DOCUMENTS

| 3,568,692 | A | * | 3/1971 | Metzger et al. ................ 137/833 |
| 7,156,118 | B2 | * | 1/2007 | Ocvirk et al. ............... 137/15.18 |
| 7,479,404 | B2 | * | 1/2009 | Cunningham et al. .......... 438/69 |
| 2003/0062089 | A1 | | 4/2003 | Guzman et al. |

FOREIGN PATENT DOCUMENTS

WO  WO 2005/108963  11/2005

OTHER PUBLICATIONS

International Search Report and Written Opinion for PCT/FR2007/001212 filed Jul. 16, 2007.
Fiorini et al: "Fabrication of Thermoset Polyester Microfluidic Devices and Embossing Masters Using Prototyped Polydimethylsiloyane Molds", LAB CHIP; vol. 3, Jul. 7, 2003; pp. 158/163; XP002501778.
Liu J; "Fabrication of Polymeric Microfluidic Devices for Protein Analysis"; Dissertation Submittes to the Faculty of Brigham Young University in Partial Fulfilment of the Requirements for the Degree of Doctor of Philosophy; Apr. 1, 2006; pp. 9-22; XP007906132.

(Continued)

*Primary Examiner* — Kevin Lee
(74) *Attorney, Agent, or Firm* — Alston & Bird LLP

(57) ABSTRACT

Method for producing a microfluidic device comprising a step in which a stamp made of elastomeric material is used for printing a photo-curable and/or heat-curable liquid disposed on a support.

18 Claims, 15 Drawing Sheets

(56) References Cited

OTHER PUBLICATIONS

Fiorini et al: "Rapid Prototyping of Thermoset Polyester Microfluidic Devices"; Analytical Chemistry; vol. 76, No. 16; Aug. 15, 2004; pp. 4697-4704; XP002501779.

Jakeway S C et al: "Transition of MEMS technology to nanofabrication"; MEMS, Nano and Smart Systems 2003. Proceedings. International Conference on Jul. 20-23, 2003; Piscataway, NJ, USA; Jul. 20, 2003; pp. 118/122, XP010650509.

Studer V et al: "Nanoembossing of Thermoplastic Polymers for Microfluidic Applications"; Applied Physics Letters, AIP, American Institute of Physics, Mellville, NY, USA; vol. 80, No. 19; May 13, 2002; pp. 3614-3616; XP001123382.

Heon Lee et al: "Fabrication of Nanosize Patterned Substrates Using Nano Imprinting Lithography"; Microtechnology in Medicine and Biology, 2005. $3^{rd}$ IEEE/EMBS Special Topic Conference on Honolulu, HI, USA; May 12, 2005; pp. 237-240; XP010886988.

Karnik R N et al: "Stamp-and-Stick Room-Temperature Bonding Technique for Microdevices"; Journal of Microelectromechanical Systems, IEEE Service Center, Piscataway, NJ, US; vol. 14, No. 2, Apr. 2005; pp. 392-399; XP011129674.

Truckenmuller R et al: "A new bonding process for polymer micro- and nanostructures based on near-surface degradation"; Micro Electro Mechanical Systems, 2004. $17^{th}$ IEEE International Conference on (MEMS) Maastricht, Netherlands Jan. 25-29, 2004, Piscataway, NJ, USA, IEEE, US; pp. 761-764; XP010767988.

* cited by examiner

UV EXPOSURE

PHOTOIRRADIATION

PRODUCTION OF MICROFLUIDIC POLYMERIC DEVICES BY PHOTO-ASSISTED AND/OR THERMALLY ASSISTED PRINTING

CROSS REFERENCE TO RELATED APPLICATIONS

This application is a national stage application filed under 35 U.S.C. 371 of International Application No. PCT/FR2007/001212, filed Jul. 16, 2007, which claims priority from French Application No. 06 06457, filed Jul. 17, 2006.

FIELD AND BACKGROUND OF THE INVENTION

The invention relates to a new method of fabricating microfluidic devices, and also to the devices resulting from the application of this method, and their uses in microfluidic systems.

In numerous technical fields, microfluidics is being employed more and more often, whether in chemistry, in biotechnologies or in fluid mechanics, for example, with a demand on the part of users for even greater miniaturization.

In particular there is a demand for rapid prototyping techniques which allow the fabrication of microfluidic devices featuring greater complexity, shorter fabrication times, and lower costs. Furthermore, in accordance with the intended uses, the qualities of resistance to solvents (organic or aqueous), of resistance to the pressure exerted by the circulating fluid, of spatial resolution or of transparency constitute requirements which are conventional in the subject.

Conventionally there are two main approaches to the fabrication of microfluidic devices:
(i) direct etching and
(ii) replication by molding.

In the direct etching techniques, the channels are etched directly by thin-layer structuring techniques from microelectronics (electron lithography, optical lithography, reactive ion etching, etc.). The devices are finished by assembly of thin layers (anodic bonding, fusion bonding, etc.). The materials employed are silicon, glass and metals.

This approach, however, is poorly adapted to rapid prototyping, since the equipment is expensive and its operation is complex and requires very specific know-how. The fabrication times are long and the choice of materials that can be used is limited.

In the molding or hot stamping techniques, an original mold is made by direct etching processes. The micro-fluidic devices are obtained by replication of the mold in a polymeric material. The use of PolyDiMethylSiloxane (PDMS) elastomers is by far the most widespread. This results in practice in a stamp of centimeter-scale thickness on its surface. The devices are finished by closing the structures by adhesive bonding to a flat surface (glass, elastomers, silicon, etc.).

So-called Soft Lithography techniques based on the use of elastomers greatly limit the capacity of the devices to withstand the application of high pressures (deformability and adhesive bonding) and therefore to withstand the transport of viscous fluids and the use of various solvents (organic or aqueous).

Devices made wholly of PDMS are unsatisfactory to users: the construction of micron-scale structures and/or of high aspect ratios is made impossible by the deformability of the channels, which can lead to the collapse and/or blocking of channels. This is the case with devices constructed from at least one element made of PDMS.

Ultimately, PDMS possesses poor chemical and mechanical resistance properties. PDMS is swollen by many organic solvents. It is broken down by strong bases and acids. These two characteristics greatly limit the range of solvents that can be transported in PDMS devices. The low elastic modulus of elastomers such as PDMS makes these materials completely ineffective at withstanding high mechanical pressures. Finally, PDMS is permeable to gases. The base and/or the cover of the PDMS devices are thick in order to allow them to be handled. This thickness interferes with observation of the interior of the channels by optical processes.

The use of other polymeric materials (vitreous materials in particular) is greatly limited by the step of closing of the channels by adhesive bonding. In practice, adhesive bonding on metallic and inorganic substrates remains an insurmountable barrier, especially for devices which include micron and submicron structures. The use of fine polymer layers to facilitate adhesive bonding is detrimental to the optical properties of the device, increases the overall thickness of the device, and alters its surface properties.

The present invention eliminates the drawbacks of the prior art by virtue of a new method of fabricating polymeric microfluidic devices by photo-assisted imprinting.

This fabrication process employs simple and inexpensive equipment and can be used in rapid prototyping. It provides access to devices which have a high spatial resolution, are transparent, resist organic and aqueous solvents, withstand pressures, are of reduced size, and are capable of integrating different materials.

Document WO 2005/030822 describes a method of fabricating a microfluidic device on the basis of photocrosslinkable perfluoropolyethers. A rigid substrate having a defined profile is used as a molding support. A liquid perfluoropolyether polymer precursor is placed on the mold. Photocrosslinking of the polymer gives a part of the device comprising the imprint of the molding. This part is removed from the mold and placed in contact with a support of the same material. A second irradiation attaches the two parts of the device.

This method is not without drawbacks: the perfluoro-polyether is selected for its qualities of elasticity, which allow it to be removed easily from the mold, and for its solvent resistance. However, the requirement to be able to displace the molded polymer means that it must be given a base with a sufficient thickness, which limits the use of this process for the following purposes: ensuring rapid thermal control, conserving the optical properties of the base, etc. The elastomeric material has by nature a poor resolution; it is difficult to obtain structures featuring channels with a size of less than 100 µm. Lastly, these devices are difficult to stack.

T. Cabral et al., Langmuir, Research Article, 2004, 20(23), 10020-10029, describe a method of fabricating microfluidic devices by frontal photopolymerization. A photocrosslinkable polymer is placed between two plates which are held apart by means of spacers, and a treatment with UV allows the polymer to be solidified in accordance with the selected profile. The use of spacers, however, restricts production to structures with a thickness of approximately 400 µm. The patterns that can be obtained by this method have a size which is greater than the optical wavelength employed. The channels obtained by this method have a width of 600 µm. The non-crosslinked polymer is removed by means of a solvent and by introducing pressurized air into the microcircuit. It is impossible, however, to remove all traces of prepolymer entirely, especially in the parts of the circuit that lack an outlet.

Finally, the need to irradiate the polymer through a glass strip imposes low resolution on the device, owing to the diffraction of luminous radiation through the glass strip. The supports which can be used by this method are few.

Document US 2006/0014271 describes a method of fabricating an entirely polymeric microfluidic device. However, the drawbacks are essentially the same as for the above method: thickness of the device and poor resolution.

V. Studer et al., Applied Physics Letters, 80(19), 3614-3616, 2002 describe a method of hot-nanomolding thermoplastic polymer pellets to form microfluidic devices. The resulting devices have satisfactory resolution and satisfactory solvent resistance, but their resistance to pressure is wanting, since the thermal bonding of the two polymeric parts does not allow the production of structures which are resistant to high pressures. Moreover, this process does not allow the finishing of the devices by adhesive bonding in an aqueous medium.

Jakeway et al., Proceedings of the International Conference on MEMS, Nano and smart systems, Jul. 20-23, 2003, pp. 118-122, and H. Lee et al., Microtechnology in Medicine and Biology, May 12, 2005, 237-240, describe a method of fabricating an article which comprises a base and side parts forming a channel. This article is produced by imprinting a stamp in a photo-crosslinkable resin and then carrying out UV irradiation. These articles, however, do not include a cover, and there is no known process allowing the closure of such a device under conditions permitting its use in microfluidics (imperviousness to liquids, resistance to pressure, resistance to solvents). The processes known to date for closing a nonthermoplastic microfluidic device require the use of a glue, or a surface treatment, which alter the chemical properties of the materials employed.

There is therefore still a need for a method that allows microfluidic devices to be produced by rapid prototyping, which is simple, inexpensive, and yields a product that features very high resolution, high resistance to aqueous or organic solvents and to pressure, with dimensions which can be reduced down to channels of micron size order.

SUMMARY OF THE INVENTION

The present invention provides a method of fabricating a microfluidic device, said method being characterized in that the starting material used is a stamp made of an elastomeric material such as PDMS that comprises a profile complementary to that of the device it is desired ultimately to obtain. The elastomer stamp is used to imprint a photocurable and/or thermosetting liquid, such as a liquid resin composition of photo-crosslinkable and/or photopolymerizable polymer, which is placed on a support of choice.

After photoirradiation and/or heating of the photo-curable and/or thermosetting liquid, especially of the resin, either through the elastomer stamp, especially PDMS stamp, or through a support on which the polymer is deposited, the elastomer stamp is withdrawn to give the part (profiled base) of the microfluidic device having the profile complementary to that of the stamp. In certain cases, simple exposure to either natural or artificial, visible or UV radiation is sufficient.

The use of the elastomer stamp, especially PDMS stamp, as a mold for imprinting the device allows it to be withdrawn easily after photocrosslinking or thermal crosslinking and/or photopolymerization or thermal polymerization, since the PDMS does not adhere to photocrosslinkable or thermally crosslinkable and/or photopolymerizable or thermally polymerizable resins. With an appropriate irradiation dose, photopolymerization or thermal polymerization and/or photocrosslinking or thermal crosslinking do not take place at the stamp/resin interface. This interface then contains active polymerization or crosslinking sites. It is possible subsequently to place a cover on this interface of the base of the device. This cover may be made of any appropriate material such as glass, photo-sensitive resin or silicone elastomer oxidized in an oxygen plasma. Irradiation, preferably in-press irradiation, of the profiled base+cover device seals the microfluidic device without the need to use a glue. In certain cases, however, simple exposure to either natural or artificial, visible or UV radiation is enough to seal the device. In one variant of the invention, this step may be replaced by or supplemented with a heat treatment, such as heating in an oven, on a hot plate, or a treatment with infrared radiation. The duration and the intensity of the irradiation and/or the heating allow the quality or the strength of the adhesive bonding to be modified.

As a result of this method it is possible, starting from a material initially in the liquid state, to obtain a microfluidic device which has a solid structure, has very good resolution and is resistant to solvents and to pressure. Such a device may be fabricated rapidly and employs inexpensive raw materials. The imprinted circuit in this device may be designed at the choice of the user, and may subsequently be integrated in a larger microfluidic system.

By a microfluidic device is meant a device through which fluid materials, such as liquids, are caused to flow, on a scale ranging from the picoliter to the microliter. A microfluidic device comprises at least one flow channel and/or reservoirs, and may further comprise reaction chambers, mixing chambers and separating zones.

The method of the invention pertains to the fabrication of a microfluidic device comprising at least one base (2) and at least two side parts (4') defining a pattern such as a channel (6), this method being characterized in that:

i—a stamp (1) made of elastomeric material, comprising a profile (1a) complementary to that of the microfluidic device, is used as a mold, ii—the base (2), composed of a plate made of solid material, which is capable of reacting with the photocurable and/or thermosetting liquid, is placed parallel to the stamp (1), iii—photocurable and/or thermosetting liquid (4), in appropriate amount, is deposited on the base (2), iv—the stamp (1) is placed on the base (2) by applying a pressure (P) to the stamp, the liquid occupying the hollow areas (1c) of the elastomer stamp, v—the liquid (4) is treated by irradiation and/or by heating so as to bring about its curing, vi—the stamp (1) is removed from the device.

BRIEF DESCRIPTION OF THE DRAWINGS

The invention will be understood more fully from the detailed description which follows and from the accompanying drawings, in which.

MORE DETAILED DESCRIPTION

Figure 1A:
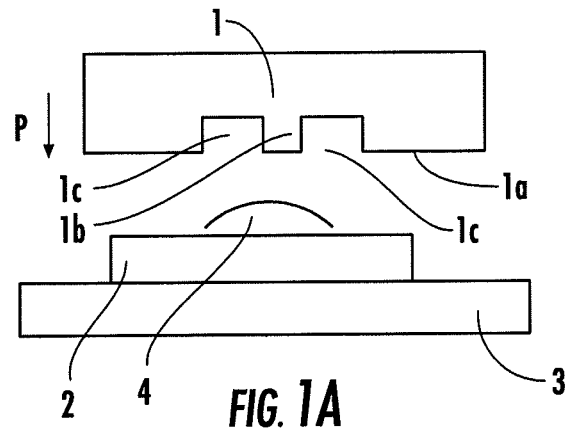
FIGS. 1 to 18 are schematic illustrations of the method and device of the present invention.

In greater detail, the method of the invention pertains to the fabrication of a microfluidic device comprising at least one base (2) and at least two side parts (4') defining a pattern such as a channel (6), this method being characterized in that (FIGS. 1A, 1B, 1C):

i—a stamp (1) made of elastomeric material, comprising a profile (1a) complementary to that of the microfluidic device, is used as a mold, ii—the base (2), composed of a plate made of solid material, which is capable of reacting with the photo-crosslinkable and/or photopolymerizable liquid resin composition (4), is placed at a distance from the elastomer stamp (1), and parallel to the stamp (1), iii—the photocrosslinkable and/or photopolymerizable liquid resin composition (4), in appropriate amount, is deposited on the base (2), iv—the stamp (1) is placed on the base (2) by applying a pressure (P) to the stamp, the liquid resin composition occupying the hollow areas (1c) of the elastomer stamp, v—the liquid resin composition (4) is irradiated with radiation appropriate for producing its polymerization and/or crosslinking, vi—the stamp (1) is removed from the device.

Figure 1B:
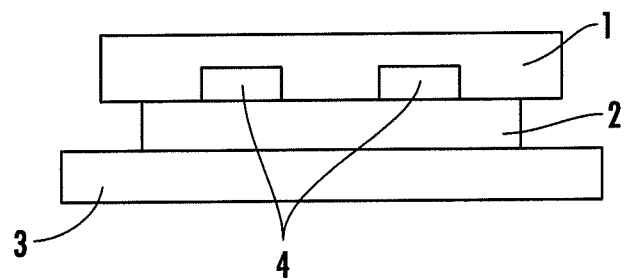

Irradiation may be performed through the stamp (1), as shown in FIG. 1B, or through the support (3) and/or the base (2) (variants not shown).

According to the invention and as shown in FIG. 1A, a stamp (1) made of elastomeric material, more particularly PDMS, comprising a profile (1a) is used as a mold. The stamp contains a protuberance (1b) of rectangular section that corresponds to the channel (6) of the microfluidic device it is desired to obtain. It also comprises two hollow areas (1c) of rectangular section on either side of the protuberance (1b). The profile (1a) is complementary to that of the microfluidic device which it is the aim to produce.

The base (2) is composed of a plate made of solid material which is capable of reacting with the photo-crosslinkable and/or photopolymerizable resin, such as, for example, glass, silicon, a solid polymer film, a metal (copper, aluminum, steels, gold, etc.), a conducting or semiconducting alloy (ITO, SiC, SiN, GaN, AsGa, etc.), a ceramic, quartz, sapphire, or an elastomer (PDMS, polyurethane, etc.).

The base (2) is preferably composed of a glass lamella. In order to allow certain applications, it is preferable for the base to have a very low thickness.

Figure 1C:
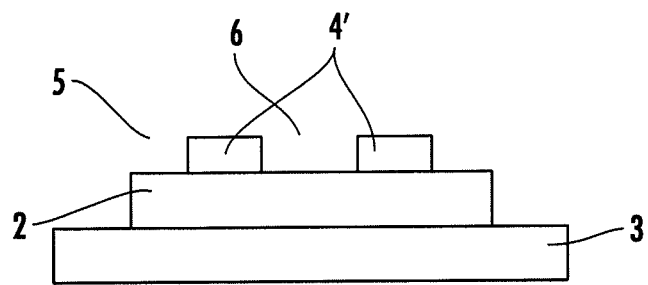

In order to facilitate manipulation during the method, and as shown in FIGS. 1A, 1B and 1C, the base is preferably placed on a support (3), which can be removed at any time. This support is made of any material appropriate for this use. It may be composed of the base of a press on which the device is placed.

A photocrosslinkable and/or photopolymerizable resin composition (4) in liquid form and in appropriate amount is deposited on the base (2). The photo-crosslinkable and/or photopolymerizable resin is a solution or dispersion based on monomers and/or prepolymers. In the method of the invention, photo-crosslinkable and/or photopolymerizable resins are used that are typically used as adhesives, glues or surface coatings. It is advantageous to select adhesives, glues or surface coatings that are typically employed in the optical sector. When they have been irradiated and photocrosslinked and/or photopolymerized, such resins provide a solid which is preferably transparent and devoid of bubbles or of any other irregularity.

Resins of this kind are generally based on monomers/comonomers/prepolymers of epoxy, epoxysilane, acrylate, methacrylate, acrylic acid, and methacrylic acid type, though mention may also be made of thiolene, polyurethane, and urethane-acrylate resins, and the resins can be replaced by photocrosslinkable aqueous gels such as polyacrylamide gels, and they are selected so as to be liquid at ambient temperature.

The photopolymerizable and/or photocrosslinkable resins which can be used in the present invention include the products sold by Norland Optics under the brand name NOA® Norland Optical Adhesives, such as, for example, the products NOA81 and NOA60; the products sold by Dymax in the range "Dymax Adhesive and light curing systems"; the products sold by Bohle in the "UV adhesives" range; and the products sold by Sartomer under the trade names SR492 and SR499.

Besides the resin itself, the photocrosslinkable and/or photopolymerizable resin composition may comprise typical additives such as inorganic particles. In particular, metallic particles, magnetic particles or semiconductive particles may be employed in these compositions.

The treatment of the photocurable and/or thermosetting liquid, in particular the treatment for the purpose of polymerization and/or crosslinking of the resin compositions, is accomplished by photoactivation using any appropriate means, such as irradiation by UV or visible radiation, or else by heating (hot plates, oven, infrared radiation).

It is preferred to select a resin which, when it has been polymerized and/or crosslinked, is rigid, and not flexible, since elastomeric resins have a tendency to deform when fluids under pressure are circulated in the device. For certain applications, however, the use of elastomeric photocrosslinkable resins is not excluded.

After the liquid resin (4) has been deposited on the base (2), the elastomer—more particularly PDMS—stamp (1) is placed on the base (2). The liquid resin moves into the hollow areas (1c) of the elastomer stamp. A pressure (P) is applied to the stamp in order to expel any excess glue. In FIG. 1B, the projecting parts and especially the protuberance (1b) of the elastomer stamp (1) are in contact with the base (2). The liquid resin (4) adopts the form of the hollow areas (1c) of the stamp (1). Irradiation of the resin (4) is carried out in the axis perpendicular to the base of the device, through the stamp (1). Irradiation must be metered in such a way that, if desired, active polymerization and/or crosslinking sites are left at the upper surface area of the resin side parts (4'). The stamp (1) is then removed from the device. FIG. 1C shows the photopolymerized and/or photocrosslinked resin side parts (4') of the device (5), having a rectangular profile which is complementary to that of the hollow areas (1c) of the stamp (1). These side parts (4') are attached to the base (2) and define a channel (6). It is possible to envisage the profile of the stamp being adapted such that the photopolymerized and/or photocrosslinked resin defines other patterns.

The term "channel" is employed broadly here to denote any hollow or recessed part in the profile of the device of the invention.

Imprinting using an elastomer stamp in a liquid-state resin (4) allows structures (6, 4') to be obtained which are very small in size and have a very good resolution. A cover (7) may then be attached to the rest of the device.

The cover (7) of the device may be made of any appropriate material able to react with the active polymerization and/or crosslinking sites of the side parts, such as, for example, of glass, silicon, a solid polymer film, a metal, a conducting or semiconducting alloy, a ceramic, quartz, sapphire, an elastomer. Preference is given to selecting a glass strip, a polymer film, a silicon strip. The materials used to form the cover and the base are selected according to the application to which the device will be put.

A cover and/or a base made of silicon are more appropriate for producing chips equipped with integrated microelectric elements (for example, of type CMOS, standing for complementary metal oxide semiconductor) for detecting or measuring local physical/chemical properties (temperature, pressure, concentration of a species, electrical potential, current, etc.). Gluing a profiled base fabricated by the method of the invention to a DNA chip or to a protein chip, generally made of silicon or of glass, can also be envisaged, and allows the production of biochips. This in turn allows coupling between DNA chip and microfluidic technologies.

A cover and/or a base made of polymer film are more appropriate for producing low-cost, disposable devices or for carrying out digital microfluidics (droplet microfluidics). The transport of emulsion droplets in confined geometries is possible only if the wetting properties of the walls are unfavorable toward the droplets transported. For droplet transport it is preferred to use chemically homogeneous channels which are therefore composed of a single material.

For certain applications it may be necessary to have flexible channels (fabrication of valves, for example). In that case a photocrosslinkable/polymerizable elastomer will be highly suited for the base/cover.

A cover and/or a base made of glass are more appropriate for facilitating observation and optical detection (transparency).

Another important application concerns the use of glass strips for carrying out cell cultures. More generally, the use of glass makes it possible to exploit the versatility of chemical and biological surface treatments that exist for this substrate.

Another benefit of glass is its very good thermal conductivity. It allows the devices to be heated homogeneously.

The cover may be made of the same or a different material than that of the base.

For example, it is possible to consider fabricating a profiled base which is flexible and/or is made of a flexible material, in order to attach it to a cover, which should be not planar but rounded in form, as are the laboratory vessels employed for containing liquids (beakers, test tubes, funnels, columns, etc.).

Figure 2A:
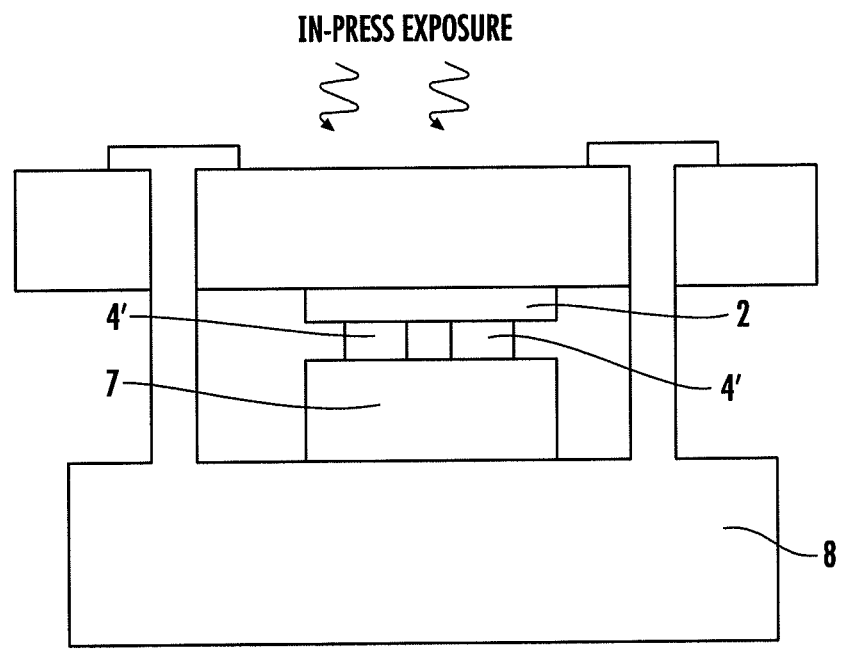

In FIG. 2A: the cover (7) is placed on a planar support of the press (8). The base (2) on which the side parts (4') of the device are attached is placed on the cover so as to close the device.

Figure 2B:
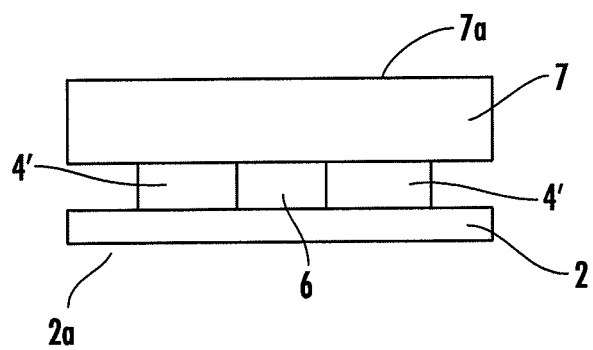

The press (8) is employed in order to keep the assembly under pressure, and the assembly is treated by irradiation, or by heating, so as to attach the cover (7) to the side parts (4') by photopolymerization or photocrosslinking. Irradiation is conducted at a wavelength which is appropriate to the material to be treated. The photopolymerization and/or photo-crosslinking in press may be carried out in an aqueous medium. The pressure which is exerted expels the film of water which has entered between the closure material and the crosslinked resin. The assembly is then withdrawn from the press (8). The device of FIG. 2B is obtained, comprising the following: a cover (7), a base (2), and two side parts (4'), defining a channel (6) intended for the circulation of fluids.

Any means other than a press that is able to impose a pressure on the profiled base+cover assembly may be selected.

The base (2) and the cover (7) each have a face external to the device—(2a) and (7a) respectively—which may be used as a base in a second operation of creating a microfluidic profile by imprinting an elastomer stamp into a resin, followed by photo-polymerization and/or photocrosslinking.

The repetition of such steps of creating a profile and then carrying out closure with a cover allows multiple-stage devices to be obtained. The existence or absence of fluidic connections between these circuits is determined by the use of perforate or imperforate intermediate covers/bases. For example, superposed noncommunicating circuits may be employed in order to impose predetermined thermal conditions on one of the circuits, by circulating a controlled-temperature fluid in an adjacent circuit.

In one version of the invention provision may be made for the method to be carried out in two phases, with each of the two steps being spaced apart in time. According to this version, a profiled base is fabricated as described above and is illustrated in FIGS. 1A, 1B, and 1C, and then the profiled base, composed in FIG. 1C of the parts (2) and (4') and combined on its (optional) support (3), is deposited, as illustrated in FIG. 15A, on a temporary support, in this case on a thin sheet (30), made of a material which does not react with the photocrosslinkable polymer. The profiled base is in contact with the thin sheet (30) of material via the upper face of the side parts (4'), which contains active polymerization sites. The inert nature of the material constituting the thin sheet (30) with respect to the active polymerization sites prevents the sealing of the bond between the profiled base and the thin sheet (30). The profiled base may therefore be stored for the desired time until being used to produce a closed device. According to this same version, it is possible, quite simply, to leave the stamp (1) on the profiled base, with this stamp, which is inert toward the active polymerization sites, playing the part of temporary support (30). It is removed only when the desire is to use the profiled base to produce a closed device.

According to this version, the material employed for the base and the side parts is advantageously a flexible material, such as an elastomer—a silicone elastomer, for example. The combination of a profiled base, comprising a base (2) and side parts (4') made of photocrosslinkable and/or photopolymerizable resin, whose upper faces include active polymerization sites, with a support (30) made of a material which does not react with the photocrosslinkable and/or photo-polymerizable resin, constitutes a further subject of the invention.

When the base (2) and the side parts (4') are composed of a flexible and/or fine material, it is preferred that provision be made for keeping them in combination with a rigid support (3), which allows them to be handled.

According to this version, when it is desired to close the profiled base definitively, it is removed from its temporary support (30), in the same way as a sticker would be removed, and as illustrated in FIG. 2B, the profiled base is deposited on its cover (7), and then the assembly is irradiated, optionally with application of pressure thereto at the same time, in order to end up with a device as illustrated in FIG. 2B.

Figure 13A:
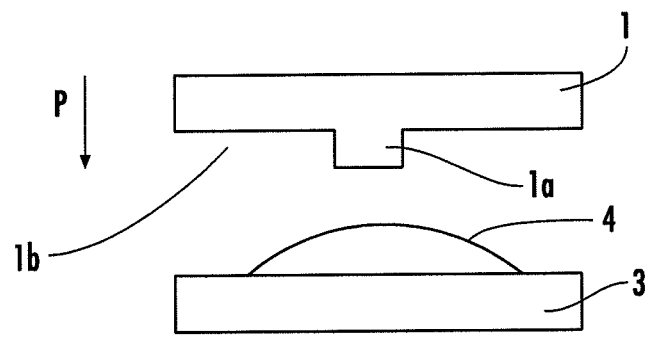
Figure 13B:
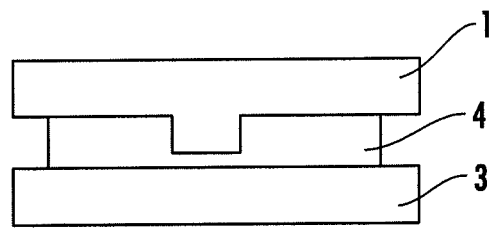
Figure 13C:
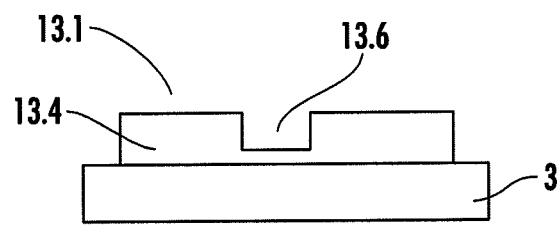
Figure 15C:
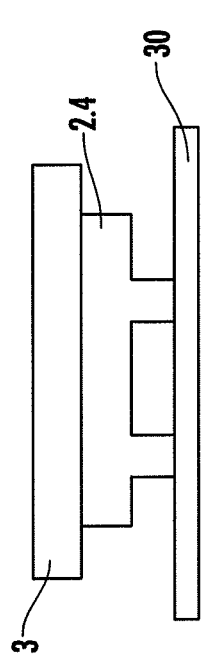
Figure 15D:
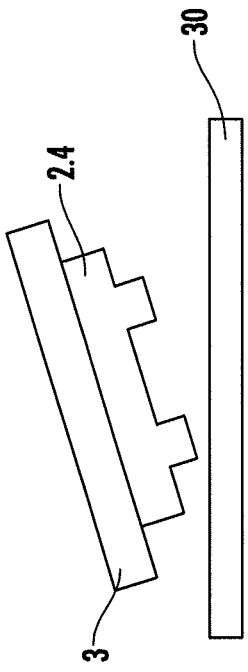
Figure 15A:
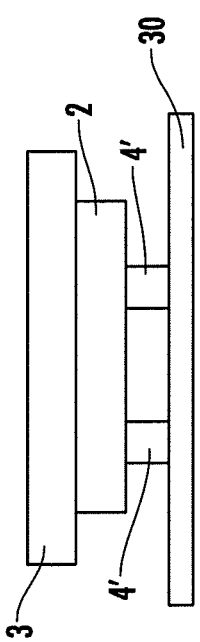
Figure 15B:
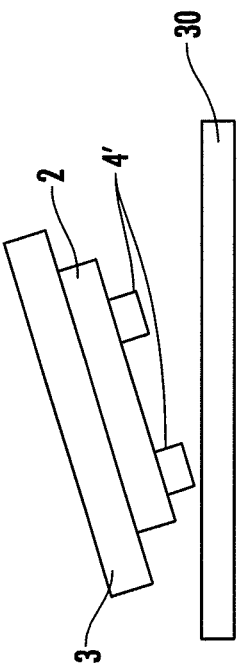

FIGS. 15C and 15D represent the same steps as the version of FIGS. 15A and 15B for the case where the profiled base is produced entirely of resin and in a single step, as described in FIGS. 13A to 13C: the profiled base (2.4), supported by its support (3), is placed, by its face comprising active polymerization sites, on a temporary support, in this case on a thin sheet (30), made of a material which does not react with the photocrosslinkable polymer. When it is desired to close the profiled base (2.4) definitively, it is removed from its temporary support (30), in the same way as a sticker would be removed.

Depending on the material of which the base (2) or the profiled base (2.4) is made, the support (3) is retained until the final step or is withdrawn earlier.

This version allows the mass production of profiled bases of microfluidic circuits, which are distributed to different users, being supported by a thin sheet of material which is inert toward the photocrosslinkable polymer. These profiled bases are subsequently placed by each user on the cover which is appropriate for the implementation thereof in the intended application.

According to this version, the support, made of a material which does not react with the polymer, is selected from materials such as the following: a fluoropolymer (Teflon®, for example), a silicone elastomer, an organic or inorganic surface bearing a halogenated coating, an adhesive tape (for example, Scotch®).

Figure 3:
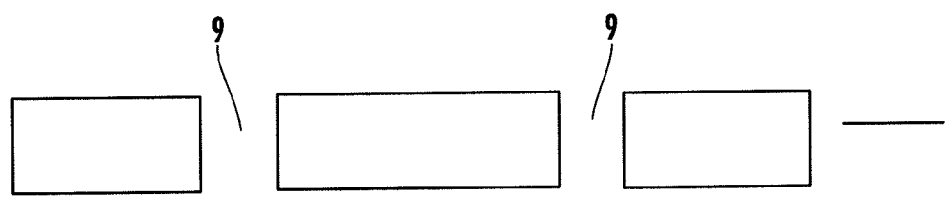

FIG. 3: It is advantageous for the orifices (9) in the cover (7) of the device of the invention to be perforated before the cover is attached to the side parts, so as to allow the attachment of connectors at the appropriate locations of the channel.

The selection of the connectors and of their locations is made as a function of the substrate and of the intended application. Their attachment is accomplished by any appropriate means, in particular using glue, such as, for example, using the photopolymerizable and/or photocrosslinkable resin which has been employed to form the side parts of the device.

Figure 4:
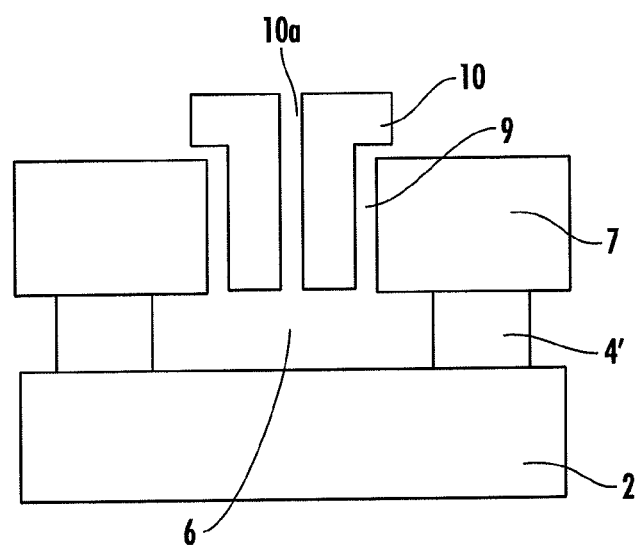

FIG. 4 is a vertical section through a device of the invention at the level of a connecting element (10). The connecting element (10) is traversed vertically by a channel (10a) which allows fluids to be injected into or recovered from the channel (6) of the device. The connecting element (10) is inserted into the orifice (9) in the cover (7) and is attached tightly in said orifice using optical glue.

The elastomer—especially PDMS—stamp which has been employed in molding the device of the invention is fabricated conventionally by the technique known as "soft lithography": a resin-based or silicon-based mold is used as an initial support. The elastomer is poured into the mold, then crosslinked and demolded.

Generally speaking, the stamp used to fabricate the microfluidic device of the invention is made of flexible, more particularly elastomeric, material which is transparent to the optical radiation (UV, IR, visible) which will be used to crosslink the photo-crosslinkable resin, and it is permeable to gases. The material used with preference is a polydimethylsiloxane (PDMS), although other materials having the same properties may also be used, such as a polyurethane elastomer, for example. The material used to form the stamp must be able to form a profile which features very good resolution, since the resolution of the microfluidic device is dependent in particular on that of the stamp.

The silicon or resin molding support may be made by optical lithography or by electronic lithography for improved resolution.

Any technique which allows the elastomer—more particularly PDMS—stamp to be obtained with the appropriate profile is acceptable for the implementation of the present invention. Preference, however, is given to the technologies which produce a stamp of very good resolution, allowing microfluidic devices to be obtained which likewise have a very good resolution. The PDMS molds used in the technology known as "soft imprint lithography" are generally useful in the present invention.

Figure 5:
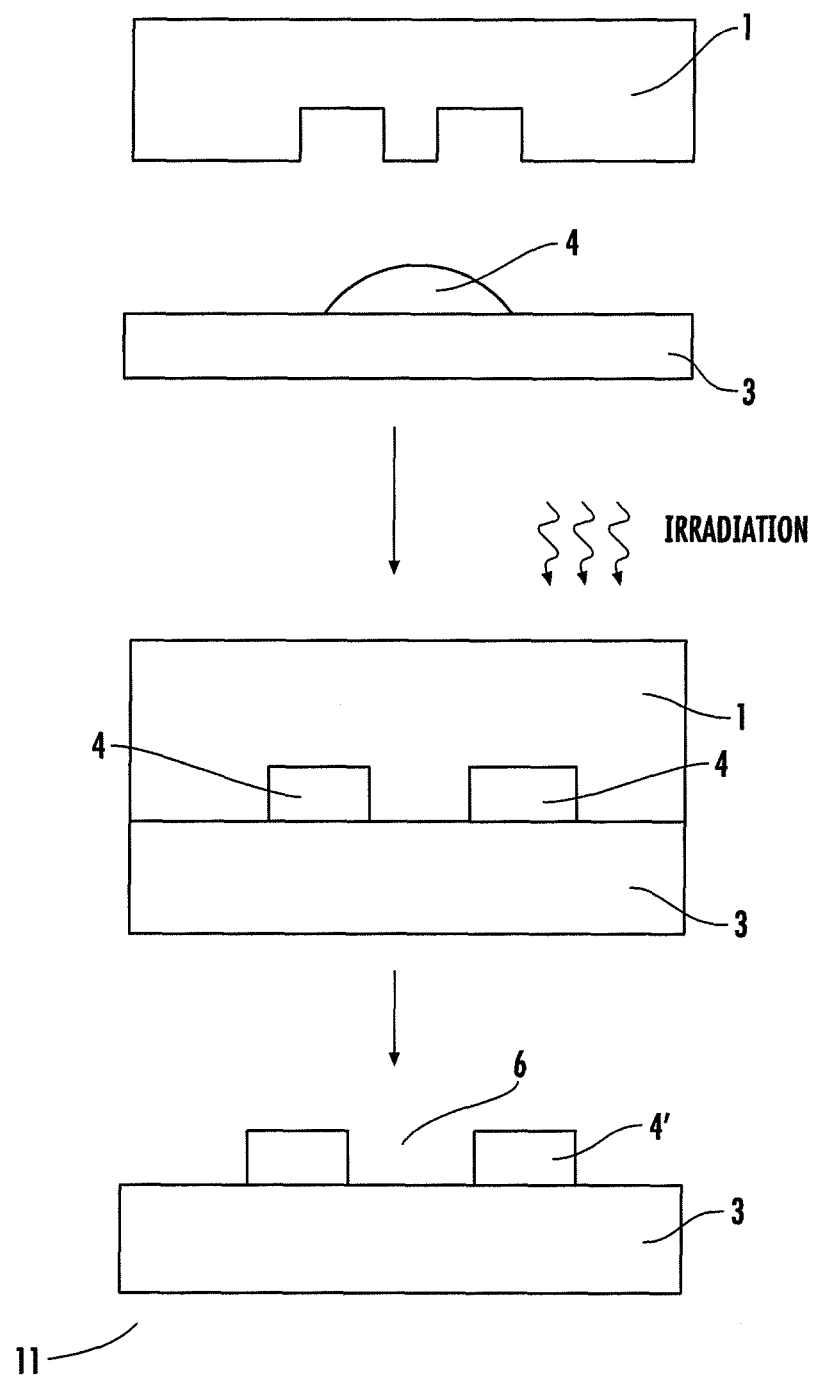

According to one version of the invention it is possible to produce a microfluidic device which has a three-dimensional structure. According to this version, which is illustrated in FIG. 5, a plate (3) made of material that does not react with the resin, such as PDMS, is used as support. The photocrosslinkable resin (4) in liquid form is deposited directly on the PDMS plate. A stamp (1) of PDMS or of another elastomeric, gas-permeable material, having a profile complementary to that which it is desired to imprint on the resin, is applied to the support (3)+resin (4) assembly. The resin (4) is photoirradiated through the PDMS stamp (1) so as to form side parts (4') of the device surrounding a pattern (6), such as a channel. The PDMS stamp (1) is then removed. The device (11) is obtained, comprising two side parts (4') made of resin and a support (3), defining a pattern (6), in this case a channel which is open in its upper part.

the same sequence of operations is repeated so as to form the side parts of a second device;

the assembly is irradiated so as to attach the two devices to one another by their side parts.

Figure 6:
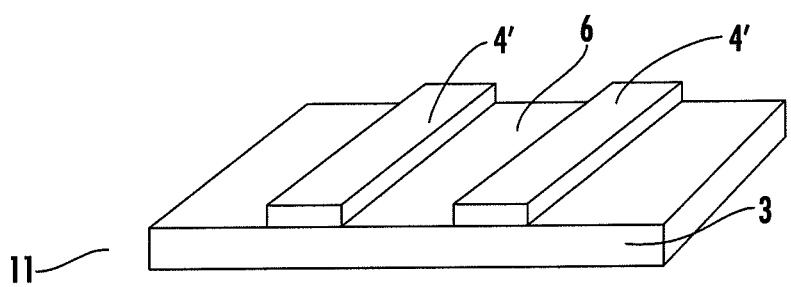

The device (11) is shown in perspective in FIG. 6. The two devices, placed on their respective PDMS supports, are then placed one atop the other in the desired configuration, advantageously with communication between the channels.

According to yet another version, a PDMS stamp (1) can be placed on a support (3) likewise made of PDMS, and a photocurable or thermosetting liquid, such as a photo-polymerizable or photocrosslinkable resin composition (4), may be injected into the orifices which have been left free by the relief of the stamp.

The invention accordingly further provides a method of fabricating a microfluidic device comprising at least one base (2), at least two side parts (4') defining a channel (6), said method being characterized in that it comprises at least the following steps:

i—a stamp (1) made of elastomeric material, comprising a profile (1a) which is complementary to that of the microfluidic device, is used as a mold, ii—the elastomer—especially PDMS—stamp is placed on a support (3) or a base (2) likewise made of elastomer, iii—a photocurable or thermosetting liquid, such as a photocrosslinkable and/or photopolymerizable resin composition (4) in liquid form and in appropriate amount, is injected into the hollow areas (1c) of the stamp, on the support (3) or on the base (2), iv—the photocurable or thermosetting liquid (4) is treated by irradiation, using appropriate radiation, and/or by heating, to bring about its polymerization and/or its crosslinking, v—the stamp (1) is removed from the device.

This sequence of operations leads to the same configuration as in FIG. 5, but avoiding the need to apply a high pressure to the stamp (1) on the support (3) in order to expel the resin from it.

The device may then be attached to a cover or to another base, or else to another device in order to form a network.

Figure 7:
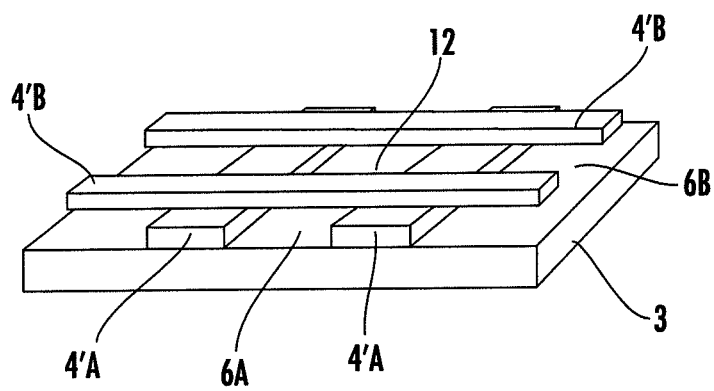

FIG. 7 shows a two-level device: The PDMS support (3) carries two side parts (4'A) made of crosslinked resin, and the assembly defines a pattern (6A), in this case a channel.

An identical device has been arranged transversely on the upper face of the side parts (4'A).

The side parts (4'B), separated by a channel (6B), are placed on the first device. The PDMS support on which the side parts (4'B) were resting has been withdrawn.

The channels (6A) and (6B) advantageously communicate at their intersection (12).

The operation may be repeated as many times as desired in order to create a network of patterns, and more particularly of channels, over a plurality of stages. In this way it is possible to provide for the creation of multiple-stage microfluidic circuits with or without mutual communication. In particular it is possible to provide for the creation of intermediate layers between the circuits, in the form of resin plates. Different photopolymerizable and/or photocrosslinkable materials may be employed for the different circuit levels. At the end, the network is attached to a base and closed with a cover as described above by photoirradiation, or by heating, of the device held under pressure.

The invention further provides a method of fabricating a microfluidic device made of photocurable or thermosetting liquid, such as a photocrosslinkable and/or photopolymerizable resin (4), which is characterized in that:

i—a stamp made of elastomeric material, comprising a profile complementary to that of the microfluidic device, is used as a mold, ii—a support composed of a plate made of solid material, which is not capable of reacting with the photocurable and/or thermosetting liquid, is placed at a distance from the elastomer stamp, and parallel to the stamp, iii—the photocurable and/or thermosetting liquid, in appropriate amount, is deposited on the support, iv—the stamp is placed on the support by applying a pressure to the stamp, without the latter coming into contact with the support, v—the photocurable and/or thermosetting liquid is treated by irradiation, using radiation appropriate to bring about its polymerization and/or crosslinking and/or by heating, vi—the stamp is removed from the device.

According to yet another version, the support has a profile which is also imprinted into the resin.

According to one version of the invention, illustrated in FIGS. 13A, 13B, and 13C, provision may be made for directly fabricating the base and the side parts of the microfluidic device in a single step and in the same material. In FIG. 13A, a photocrosslinkable resin (4) is placed on a support (3) made of a material which does not react with this resin under the normal conditions of irradiation. Provision may be made more particularly for the support (3) to be of PDMS. A PDMS stamp (1) featuring a planar profile (1b) including an elevation (1a) is placed parallel and on top of said support (3). A controlled pressure (P) is applied so as to imprint the profile of the stamp (1) into the resin (4) without said stamp (1) coming into contact with the support (3), as illustrated in FIG. 13B. Subsequently the assembly is subjected to photoirradiation, in an axis perpendicular to the support (3) (although irradiation in a different angle would lead to the same result), and the stamp (1) is withdrawn. As shown in FIG. 13C, the result is a base (13.4) featuring a profile (13.1) which is complementary to that of the stamp (1), and in particular a hollow area (13.6) complementary to the elevation (1a).

Figure 14A:
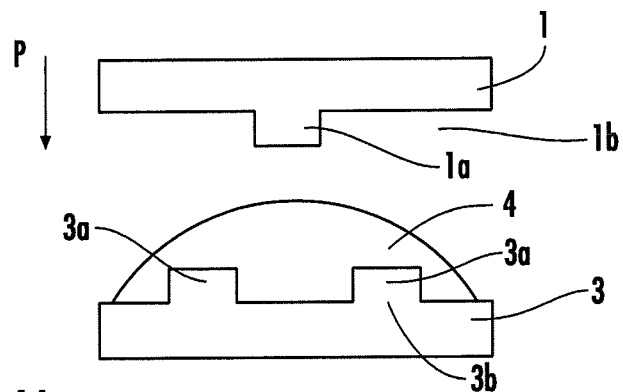
Figure 14B:
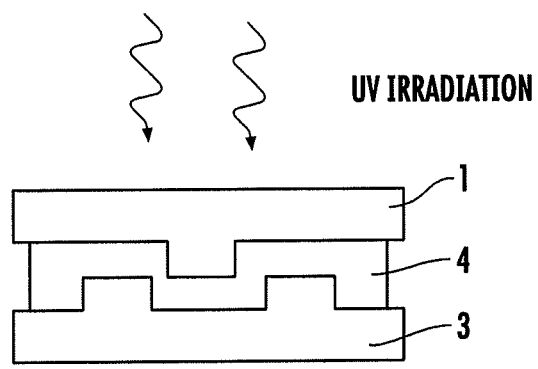
Figure 14C:
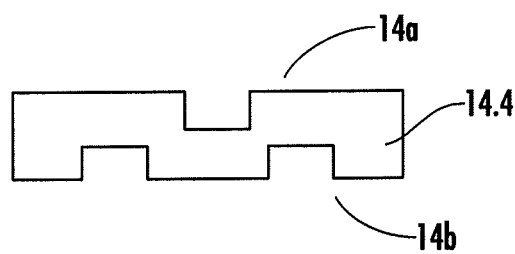

According to yet another version of the method of the invention, described in FIGS. 14A, 14B, and 14C, it is possible to fabricate a base which features a profile on its two faces. In FIG. 14A, a photocrosslinkable resin (4) is placed on a support (3) made of a material which does not react with this resin under the normal conditions of irradiation. Provision may be made more particularly for the support (3) to be made of PDMS. The support (3) comprises a planar profile (3b) comprising two elevations (3a). A PDMS stamp (1) featuring a planar profile (1b) comprising an elevation (1a) is placed in parallel and on top of this support (3). A controlled pressure (P) is applied so as to imprint the profile of the stamp (1) into the resin (4) without said stamp (1) coming into contact with the support (3), as illustrated in FIG. 14B. Subsequently the assembly is subjected to photoirradiation, in an axis which is perpendicular to the support (3) (however, irradiation at a different angle would lead to the same result), and the stamp (1) and the support (3) are withdrawn. As illustrated in FIG. 14C, the result is a doubly profiled base (14.4) featuring an upper face having a profile (14a) which is complementary to that of the stamp (1), and a lower face having a profile (14b) which is complementary to that of the base (3). It is then possible, as described above, to attach a cover to each of the faces of the base (14.4).

The description given above of the method of fabricating a microfluidic device related to the fabrication of a structure simply consisting of one channel. However, the present invention is envisaged to apply to the fabrication of microfluidic devices having a great variety of profiles: the device of the invention may be envisaged to comprise, in a single plane, two or more channels with identical or different profiles, with channel intersections, reaction chambers, reservoirs and mixing chambers. Provision may be made for the side walls of the various channels, reservoirs, and chambers to be parallel or nonparallel, so as to create, in particular, channels of variable cross section. The elastomer stamp, advantageously a PDMS stamp, is designed so as to have the profile which is complementary to that of the microfluidic device.

By applying the method of the invention it is possible to obtain structures whose resolution and aspect ratio are excellent.

In particular the method of the invention provides access to microfluidic devices whose channels can have a low width. The width of the channel of a microfluidic device is defined as being the distance between the side parts of the channel. When the side walls of the channels of the device are not parallel, the width of a channel is defined as being the lowest width of that channel. The thickness of the microfluidic device is defined as being the distance between the base and the cover of the device. The method of the invention allows low-thickness devices to be obtained. When the device comprises a succession of layers of resins in which channels are imprinted, the thickness of each channel is defined as being the distance between the upper face and the lower face of the side parts of the channel.

The invention further provides a microfluidic device comprising:

at least one base (2) composed of a plate of a rigid material such as a strip of glass or silicon, of a photocrosslinked polymer, a metal, a conducting or semiconducting alloy, a ceramic, quartz, sapphire, an elastomer;

at least two side parts (4') made of nonthermo-plastic, nonelastomeric, photocured or thermoset, more particularly photopolymerized and/or photocrosslinked resin, defining together with the base (2) at least one channel (6);

at least one cover (7), parallel to the base, which is attached to the side parts (4') and closes the channel (6) in its upper part and which is advantageously composed of a plate of a rigid material such as a strip of glass or of silicon, a photocrosslinked polymer, a metal, a conducting or semiconducting alloy, a ceramic, quartz, sapphire, an elastomer, this device being characterized in that the thickness of the channel is less than or equal to 300 µm.

The width of the channel is preferably less than or equal to 100 µm, more preferably less than or equal to 10 µm, advantageously less than or equal to 1 µm, even more advantageously less than or equal to 100 nm, and more advantageously less than or equal to 50 nm.

The thickness of the channel is preferably less than or equal to 200 µm, more preferably less than or equal to 100 µm, advantageously less than or equal to 10 µm, even more advantageously less than or equal to 1 µm, and even more advantageously less than or equal to 100 nm.

The aspect ratio, which is the width/depth ratio of the patterns that are created in the resin, may vary from 0.1:1 to 10:1, more preferably up to 100:1, and more advantageously up to 1000:1. Such varied aspect ratio values may be obtained with channels of any width, in particular of 100 µm, of 10 µm or of 1 µm.

The method of the invention provides access to devices featuring a high resolution. The resolution of these devices may be quantified by the smallest width of a pattern, such as a protuberance, which can be integrated in the device.

According to the method of the invention it is possible to obtain a resolution of the order of 100 nm.

The method of the invention allows access to devices whose total thickness is less than or equal to 300 µm, advantageously less than or equal to 200 µm, more preferably less than or equal to 100 µm.

The device of the invention is intended for use as it is, with the aid of appropriate connectors, or it may be integrated into a complete microfluidic system.

The microfluidic system, further to one or more devices according to the invention, may comprise the following elements: pumps intended for introducing and circulating fluids in the system, signal detection equipment, equipment intended for varying the environmental conditions of the fluids (temperature, radiation), equipment intended for controlling circulation in the device (valves), data control systems (computer, etc.).

The devices of the invention may be used in all sorts of applications, particularly for carrying out high-reactant-content and high-throughput screening.

In chemistry, where they are particularly useful on account of their resistance to a multiplicity of solvents, they may be used for carrying out reactions, and especially for implementing processes of combinatorial chemistry, separations and liquid-liquid extractions. They allow crystallization tests to be carried out and organic or inorganic particles/molecules to be dissolved.

They offer the possibility of synthesizing and transporting not only organic molecules but also organic, inorganic or metallic microparticles or nanoparticles in situ (such as latexes or colored pigments for cosmetology or painting, through to fluorescent nanoparticles).

Generally speaking, one important application is the implementation of formulation assistance protocols (optimization of chemical mixtures to attain a given physical and/or chemical property).

They may be used for the construction of DNA chips and protein chips.

In biology, where their compatibility with water allows cell cultures to be conducted and tests to be carried out on the cells within a device of the invention. The selection of a cover made of a gas-permeable material allows cell cultures to be preserved in a device of the invention.

The devices of the invention may be used for the study of fluids, especially the rheological properties of fluids, by virtue in particular of the pressure-resistance properties of these devices. These devices may be used, furthermore, for constructing rheological sensors, particularly with regard to the following: products extracted/used in the exploitation of petroleum deposits (crude, drilling fluids, muds), paints, cosmetic creams or else food formulations (quality control).

These devices may be used to produce monodisperse emulsions: reactants may be conditioned in droplets which hence act like microreactors.

Different reaction conditions may therefore be tried out at a very high flow rate. It is also possible to test the droplet reactivity: of polymers, cells, and of any type of reactants.

Since the devices of the invention, if desired, have a structure of low thickness, it is easy to control the temperature therein.

The possibility of having a base and/or a cover made of glass permits visual monitoring of the device.

The possibility of conducting reactions in microvolumes such as droplets allows kinetic reaction studies to be carried out.

The water resistance and solvent resistance of these devices makes it possible, whatever the application to which it is put, for the device to be washed efficiently after each use, so that it can be reused a number of times.

According to another version, provision may be made for the method of the invention to be used to fabricate devices without covers. Devices of this kind may be used as microwell plates whose configuration is adapted in accordance with the tests it is desired to carry out therein, and they can be reclosed as desired when the desired reactants have been deposited therein.

Figure 10A:
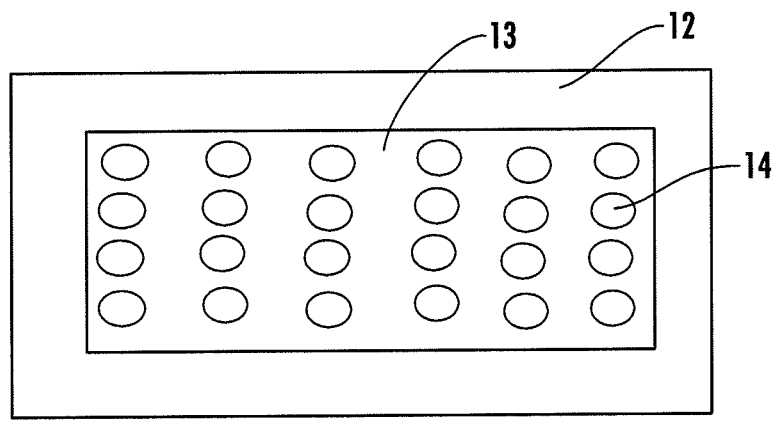
Figure 10B:
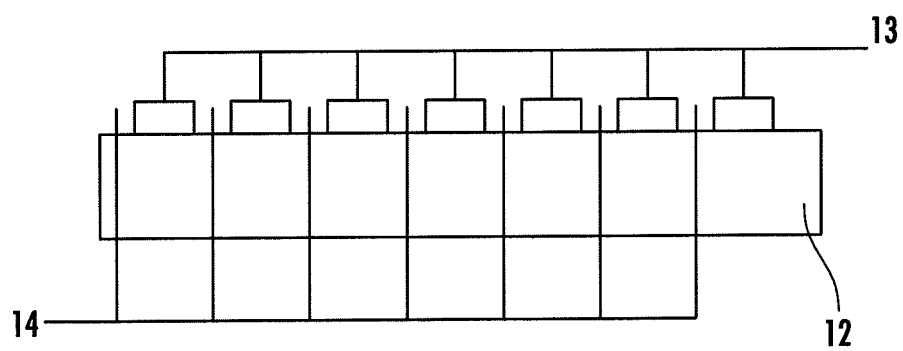

An elastomer stamp, more particularly a PDMS stamp, is designed and imprinted so as to have the profile which is complementary to the plate it is desired to obtain. Protuberances are created in the profile of the stamp at the point or points at which it is desired to obtain microwells or channels. The method represented in FIG. 1 is then applied to give, ultimately, a microwell plate as illustrated in FIG. 10A (view of the upper face) and 10B (side sectional view):

On a support (12) composed of a glass plate, a transparent, liquid photopolymerizable and/or photo-crosslinkable resin (13) has been placed by the method of the invention, said resin having been polymerized and/or crosslinked under a stamp (not shown) whose imprint defines microwells (14).

Fluid circulation channels may also be provided in order to allow fluids to circulate between the microwells.

The irradiation of the polymer may be metered in such a way as to leave active polymerization sites on the upper face of the side parts (13). After the microwells (14) have been filled, a cover may be placed over the assembly and then sealed.

Example 1

Microfluidic Device for Studying the Rheology of Complex Fluids

Context:

The rheology (i.e., the behavior of fluids under flow) is commonly characterized using rheometers, which are expensive and heavy instruments to use. For certain applications (in situ characterization of petroleum fluids, for example) it is necessary to have a characterization technique which is simpler to implement. It is also sometimes necessary to have access to the rate profile in order to demonstrate heterogeneities in the flow. An overall characterization does not allow this type of phenomena to be demonstrated.

Figure 11:
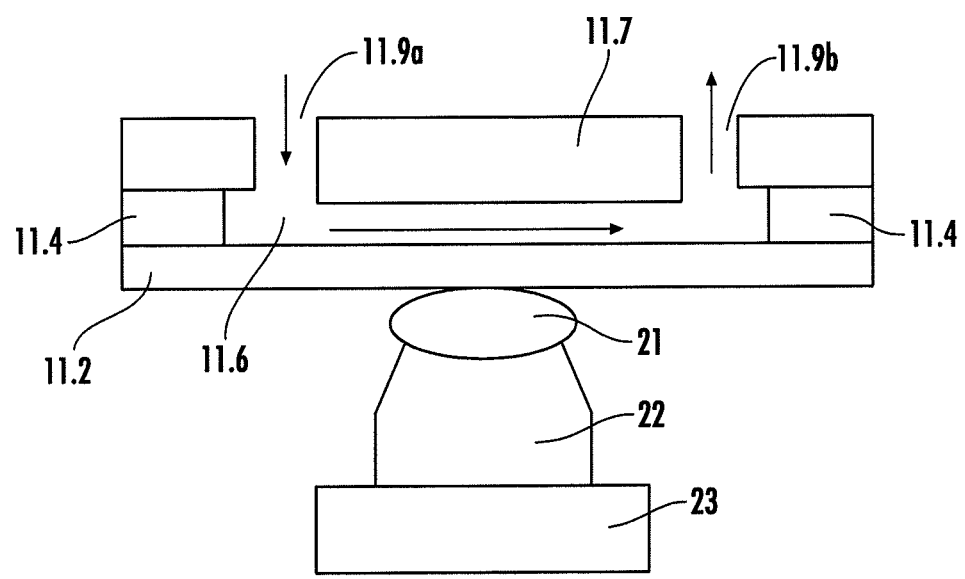
Figure 12A:
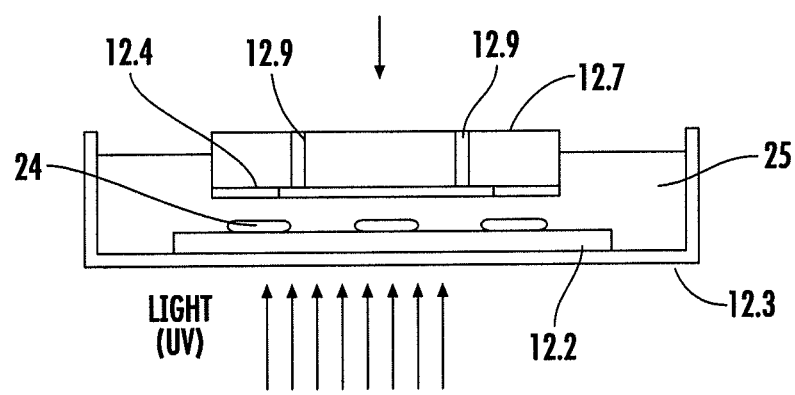
Figure 12B:
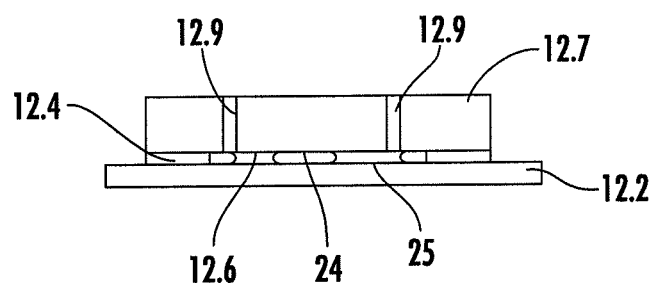

Principle:

A device in accordance with the invention is illustrated in FIG. 11: The base (11.2) is composed of a strip of glass 170 µm thick. The cover (11.7) is a strip of glass with a thickness of 1 mm, which is perforated with fluid inlet (11.9a) and outlet (11.9b) orifices. These orifices are made using connectors (not shown) in accordance with the device of FIG. 4. The side parts (11.4), made of NOA81 photopolymerizable resin, define a channel (11.6) in which a fluid can circulate.

A flow of the fluid (represented by the arrows A) is produced in a microchannel (11.6) either by controlling the pressure difference between the inlet (11.9a) and the outlet (11.9b) or by imposing a flow rate from a syringe driver. If the flow rate is imposed, the entry pressure is measured using a pressure sensor (not shown) which is arranged on the injection connector. Microchannels (11.6) of high aspect ratio—thickness: 10 µm, width: 100 µm—are used in order to facilitate the quantitative processing of the data.

The rate profile of the fluid is measured under flow using a micro-PIV (particle image velocimetry) technique. Fluorescent colloids (used as markers) are incorporated in the test fluid. Using an oil (21) immersion microscope objective (22)

of high magnification and high numeric aperture, the rate of displacement of the markers is measured in the focal plane (thickness: 1 micron) at a fixed altitude z in the thickness of the microchannel. The focal plane is then shifted in steps of a few hundredths of nanometers, using a piezoelectric device (23) on which the microscope objective (22) is placed. In this way it is possible to reconstruct the rate profile $v_x(z)$. Knowing the rate profile and the pressure gradient allows quantitative data to be obtained relating to the rheological behavior of the fluid under test.

Selection of the Device:
The base used here is a strip of glass (11.2) with a thickness of 170 μm. The use of an immersion microscopy objective necessitates the use of this particular base.

The cover selected here is a strip of glass (11.7) with a thickness of 1 mm. The use of this transparent material is appropriate to optical observations in transmission (birefringence, flow lines, etc.). It would also have been possible to use a strip of glass with a finer thickness for improved thermal control.

The photopolymerizable resin here is a commercial optical glue (Norland Optical Adhesive, NOA81). The reasons for using this type of material are threefold:
bond of the different parts resistant to high pressures;
high elastic modulus of the material, which undergoes little deformation under the pressure;
excellent optical properties for the visualization of the fluorescent colloids;
chemical resistance allowing different fluids to be studied.

Advantages:
The use of microfluidic devices fabricated by virtue of the technique described above has a number of advantages over PDMS devices fabricated by a soft lithography technique:
Possibility of studying the flow of highly viscous fluids (10 000 times more viscous than water). The bonding employed is able to resist the pressure produced by the flow of such types of fluid (several bars).
The use of devices fabricated from rigid materials (glass—NOA81) allows a considerable reduction to be achieved in the time for establishing the flow. The elasticity of elastomeric materials, especially PDMS, leads to equilibrium times which can be very long (a number of hours) when working with viscous fluids.
Additionally, the rigid microfluidic system ensures that there is a constant section along the microchannel, something which cannot be achieved in PDMS systems. Indeed, when the working pressure exceeds 200 mbar, the microchannel swells under the effect of the pressure. As there is a pressure gradient in existence along the microchannel, the cross section as well changes along the channel, which can be detrimental to certain applications.
The use of materials having good optical properties allows the use of optical technologies (PIV, fluorescence, birefringence, etc.).
The range of fluids tested is extended by the use of materials which have greater chemical resistance than PDMS (petroleum fluids).
The fabrication technique described also allows the use of microfluidic channels of high aspect ratio.

Example 2

Microfluidic Devices for the Culture, Observation, and Study of Living Cells Introduction:
In increasing numbers of studies relating to the functioning of living cells or living neurones, precise control of the environment (composition of the medium, temperature, position of the cells) is paramount. In the context of systematic biology, whose aim is to model biological systems, only precise control of the parameters of the experiment allows useful experimental data to be generated, since often the variability induced by the elements surrounding the biological system of interest (cell, neurone, bacterium, etc.) is the subject of interest. Moreover, the use of statistical physics to model the biological systems requires a large number of data in order to allow access to the fluctuations of the system and to the averages of the whole (in a cell population, for example). Consequently, microfluidics, which allows the environment of one or more cells to be controlled automatedly within a microfluidic device, is becoming a vital element of this type of study.

Problem:
Microfluidic devices dedicated to the study of living cells are presently all designed so as to culture the living cells within the microfluidic device (channel or chamber). Since cell culture is often highly intricate (particularly in the case of neurones), its realization within a microfluidic environment is not without problems, such as incompatibility between the materials used and the culturing conditions, biocompatibility of the materials, etc.

Moreover, in order to allow measurements of interest to be performed, the microfluidic device must have stringent optical properties (transmission of light, nonfluorescent, fine).

In the context of this invention we propose a simple and innovative solution.

Principle:
The microfluidic systems described above possess very good optical qualities. In particular, the fineness of the device allows observation using microscopy objectives at a very short working distance, and considerably limits the autofluorescence (which is always present, and especially so in PDMS) of the device.

The bonding of the microfluidic system may be performed in an aqueous medium. Consequently, this bonding was carried out in the cell culture medium, and the micro-fluidic device was bonded to an existing cell culture.

A living cell culture (24) on a support (12.2) composed of a strip or fine lamellar of glass, covered with an extracellular matrix (for example, polylysine or poly-alanine), is placed in a container (12.3) containing culture medium (25). A device comprising a cover (12.7) perforated with orifices (12.9) and attached to side parts (12.4) made of NOA81 resin is pressed onto the cell culture. The assembly composed of the cover (12.7), the side parts (12.4) and the support (12.2) defines a channel or a microfluidic chamber (12.6) fabricated according to the principle described above. The cells outside the channel are crushed. This step may be carried out in a press (not shown). The assembly is placed under UV (or visible or IR) so as to ensure the bonding of the side parts (12.4) to the culture support (12.2). At each time in the operation, the cell culture (24) is immersed in culture medium (25).

Advantages:
Before the cell structure of the microfluidic chamber or channels is covered, it is possible to carry out one or more fluorescent labeling operations on the cells (immunolabeling, transfection, etc.). This type of labeling generally requires a number of steps and a number of reactants, and it is therefore difficult to perform them in a microfluidic environment. This method allows us to avoid this difficulty.

The optical properties of the microfluidic systems of the invention allow a very large number of fluorescence imaging techniques to be implemented on confined cells (TIRFM, FRAP, FCS).

Using an appropriate network of channels it is possible to apply a large number of controlled conditions to the cell culture, to subject them to a gradient in concentration of a molecule, in order to study the dose-dependent response of the cells.

Example 3

Microstructured Stickers for Microfluidic Devices on Curved Surfaces (Bottles, Glassware, Test Tubes, etc.)

Figure 16:
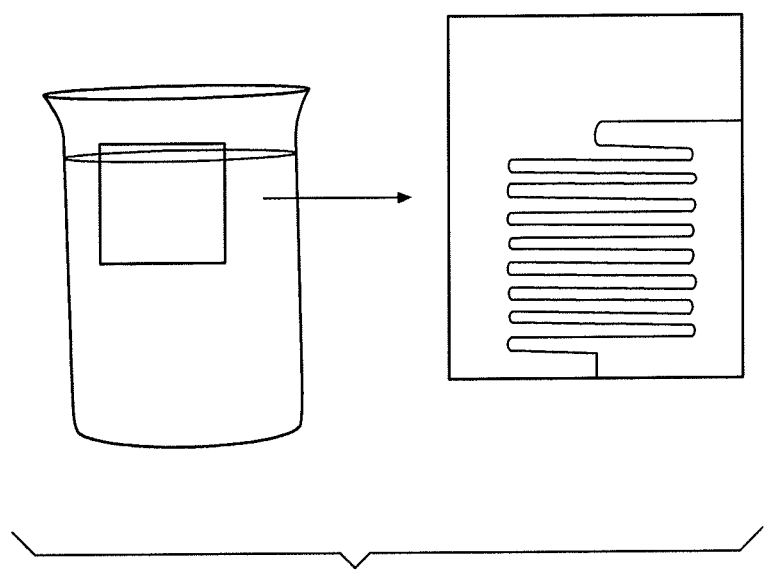

This technique, which is illustrated in FIG. 16, allows profiled bases of low thickness to be realized. Whatever the material used, this low thickness endows the stamp+base assembly with substantial flexibility. The base can be seen as a microstructured sticker. This sticker may be manipulated and glued by irradiation on covers of various shapes. This is made possible by virtue of the properties of flexibility and transparency of the PDMS stamp.

The stickers are fabricated with the aid of a soft imprinting technique. One drop of a photopolymerizable monomer is deposited on a flat or profiled PDMS support. A PDMS stamp is pressed onto the drop as shown in FIGS. 13B and 14B, so as to form a base with a single or dual profile, by exposure to light so as to polymerize the monomers. The oxygen inhibits the free-radical polymerization, which here allows a profiled base to be formed. The gas permeability of PDMS, and its permeability to oxygen in particular, makes it possible, with a controlled metering of the irradiation, to form a fine layer of active crosslinking sites on the upper and lower faces of the profiled base. Thus the two faces have adhesive properties. Following withdrawal of the stamp, the profiled base on the PDMS support is deposited, by its free face, on a substrate, to which it is made to adhere by photocrosslinking. The PDMS device is subsequently withdrawn and the second face of the profiled base may be deposited on a fluorinated PDMS film and preserved for subsequent use, or else, as in FIG. 16, it is deposited on a beaker. Provision may have been made for orifices in the walls of the beaker, in order to establish communication between the interior space of the beaker and the microfluidic circuit imprinted in the profiled base. Accordingly the liquids which are present in the beaker are able to circulate in the microcircuit imprinted on its wall.

Example 4

Device for Producing, Transporting, Visualizing, Handling, and Storing Droplets or Emulsions Microfluidic devices capable of producing and handling emulsions or isolated droplets have the potential to open up the route to new techniques for analysis, for formulation assistance and for synthesis of materials or molecules. The advantages associated with miniaturization are as follows: (i) improved control of the exchanges of material and of energy in these micro-reactors which the microdroplets may constitute, (ii) conjoint reduction in the costs and the human and environmental risks, by virtue of the extreme reduction in volumes of material (typically 0.1-1 nanoliter per droplet), (iii) control of the morphology of the droplets produced and transported in Microsystems opens up the path to the construction of high-performance materials (particles which are monodisperse and/or self-assembled after solidification of droplets, for example) such as those described in A. Ajdari and M. Joanicot, Science 309, 887-888, 2005.

Stabilizing emulsions or foams makes it necessary to slow down the coalescence of the droplets of the dispersed wall. A conventional strategy involves adding a third component (surfactant, polymer, small particles) to provide kinetic stabilization of the liquid dispersion. Given the very high surface/volume ratio of the microfluidic devices, another requirement must be fulfilled in order to produce, transport, and store microfluidic emulsions. It is necessary, indeed, to prevent the partial wetting of the walls of the channels by the droplets. To be specific, it is impossible to store oil-in-water emulsions in PDMS microchannels, even in the presence of molecular stabilizers such as surfactants or of colloidal stabilizers.

Surface modifications within PDMS microchannels are difficult to retain over the long term, and present stability problems. These modifications are not always compatible with the means employed to form the devices.

According to the invention, a profiled base is fabricated with an upper surface which preserves active polymerization sites made of hydrophilic or hydrophobic polymer which is photocrosslinkable. The wet ability properties of the walls of the channels can thus be adapted in order to produce a direct emulsion or an inverse emulsion.

Figure 17:
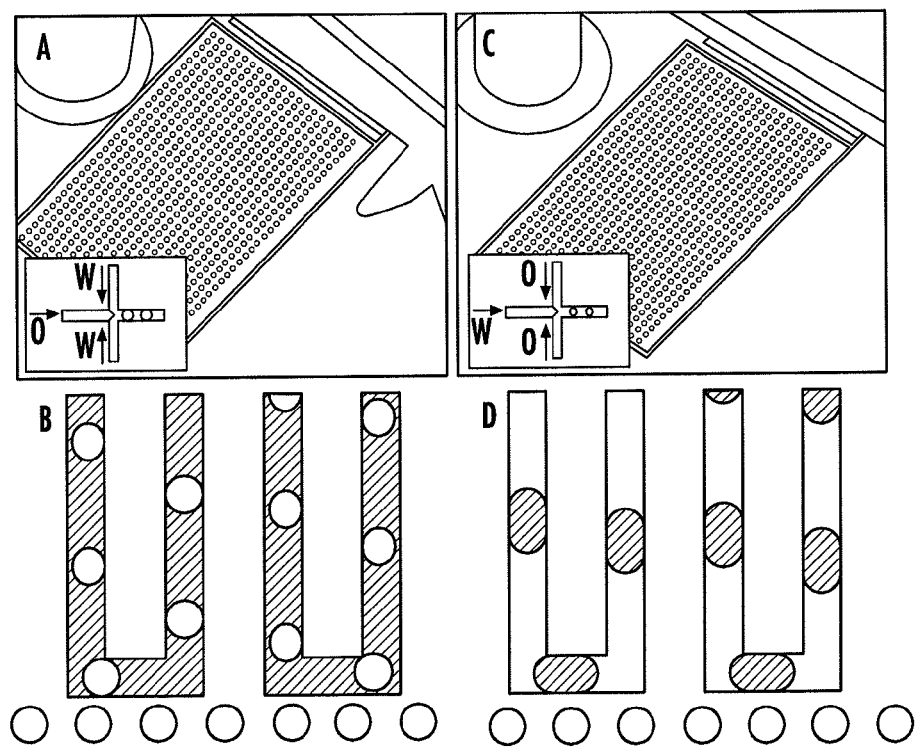

FIG. 17 shows two microfluidic devices intended for forming droplets. The one in FIG. 17A is made of NOA 81® hydrophilic resin, and the one in FIG. 17B is a crosslinked tri(methylolpropane) triacrylate. FIG. 17C shows a monodisperse emulsion of hexadecane in water which is produced in the device of FIG. 17A. FIG. 17D shows the inverse water-in-hexadecane emulsion produced in the device of FIG. 17B.

Fabrication of the Device of FIG. 17A:

A self-adhesive profiled base was placed on a glass plate. The resin of which the profiled base is composed is a thiolene resin (Norland Optical Adhesive NOA 81®). A PDMS stamp 5 mm in thickness was made by molding an original obtained by photolithography.

A 100 µl droplet of NOA 81® is placed between the PDMS stamp and a planar PDMS support. The liquid is irradiated with UV using a focused source. The PDMS stamp is then withdrawn and the profiled base is pressed by hand onto a glass plate, such as a microscopy plate, in which orifices have been made by sandblasting. A second exposure to UV (duration: 60 seconds, power: 20 mW/cm$^2$) seals the device permanently. The fluid is then injected via the orifices, to which connecting tubes (Tygon S54HL) are connected by connectors (Upchurch Nanoport N-333) in the alignment of the orifices in the glass plate. The fabrication of this device took less than 10 minutes.

Fabrication of the Device of FIG. 17B:

The procedure is the same as for the device of FIG. 17A, with the following changes: 100 µl of tri(methylolpropane) triacrylate resin and 1% by weight, relative to the weight of the resin, of a photoactivator (Darocur 1173, Sigma Aldrich) are used.

First exposure: 30 seconds, power 20 mW/cm$^2$.

The glass support is replaced by a flat plastic support (Petri dish) covered with a thin layer of tri(methylol-propane) triacrylate polymer (obtained by means of a flat PDMS stamp, exposure: 30 seconds, power: 20 mW/cm$^2$). A second exposure to UV—duration: 60 seconds, power: 20 mW/cm$^2$—seals the device. The four walls of the device are made of the same hydro-phobic material and have the same properties. The device was reinforced by fixing a second plastic support to the other face of the profiled base. Connection orifices were made in the first plastic plate before the device was sealed. The connectors used were the same as for the device of FIG. 17A.

Example 5

Microstructured Stickers for Multilayer Microfluidic Devices: 3D Microfluidic According to one version of the method of the invention it is possible to obtain structured bases (micro-structured stickers) without a residual layer. These stickers therefore constitute stencils.

Figure 18:
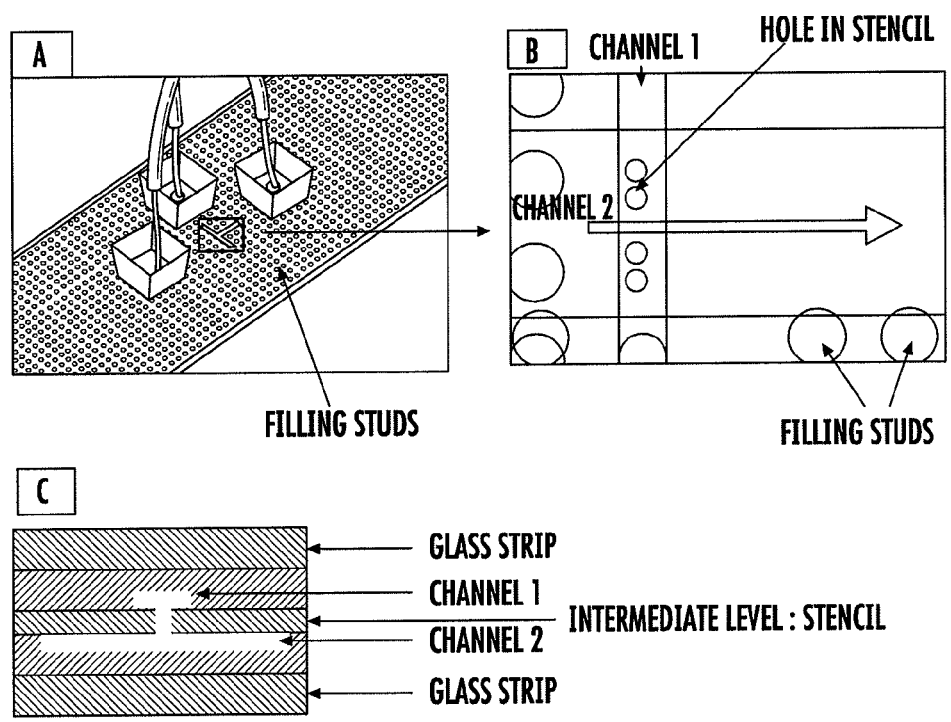

To accomplish this, the PDMS stamp is contacted with a smooth or structured PDMS support. The photo-polymerizable liquid monomer is then introduced by capillarity into the empty space between the two PDMS blocks. To facilitate filling, the stamp may advantageously be fitted out with a network of studs providing an outline of the microfluidic structure to be imprinted. See FIG. 18.

By superimposing a plurality of conventional stickers and/or "stencil" stickers, it is possible to produce interconnected 3D microfluidic devices. One such device is shown in FIG. 18B. It is composed of a straight channel on the first level. This straight channel is closed by a "stencil" sticker equipped with 5 circular openings. This assembly serves as a cover for a second straight channel. See the diagram of FIG. 18C. In this case the material used for the straight channels (conventional profiled bases) is the glue NOA 81®. A more fluid monomer is used for the stencil (tri(methylolpropane) triacrylate and 1% by mass of photoinitiator (Darocur 1173, Sigma Aldrich)).

Applications:

These three-dimensional microfluidic networks considerably increase the possibilities for integration and the number of functions of fluidic chips. Potentially all of the high-throughput screening applications are concerned.

One important application of this type of microfluidic network concerns the chemical structuring of the flows. The device of FIGS. 18A, B, and C shows that it is possible to structure the flow of two liquids into a network of parallel bands having only two entries and one exit to be connected to the device. The number, the width, and the distance between the bands and, more generally, the concentration profiles of the liquids are controlled solely by the geometry of the channels, and are independent of the number of entries and exits.

Summary of the Advantages Provided by this Invention:

Low fabrication time: Once the elastomer pad, more particularly PDMS pad, is obtained (which may contain the imprint of a number of devices), the ready-to-use systems are produced within a few minutes. The implementation of the method is very simple and requires no investment other than a source of intense illumination in UV wavelengths (or IR or visible wavelengths, depending on the resin selected) or a heating means.

Figure 8:
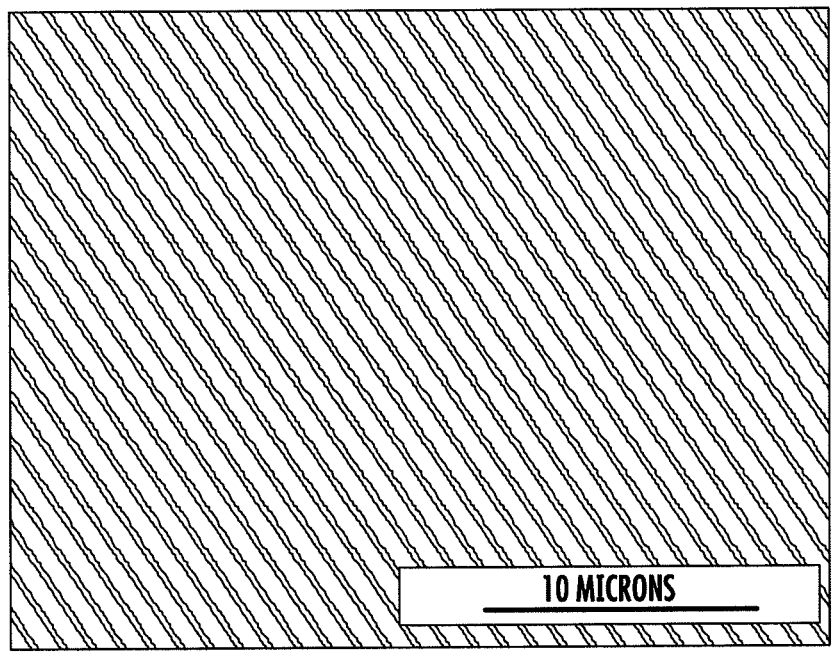

Spatial resolution: The plate obtained by electron microscopy and shown in FIG. 8 shows the surface of a photocrosslinkable NOA81 resin obtained by replication of a blazed optical grating (the distance between two lines is 830 nm). Recent studies on UV-assisted imprint techniques have shown the possibility of reducing the spatial resolution of the replicated patterns to a few tens of nanometers.

Chemical resistance: Resin material NOA81, NOA60 Norland Optics. We have been able to control flows of various organic and aqueous liquids, some of them impossible to handle in the most standard devices suitable for rapid prototyping (PDMS material): toluene, bromopropane, n-heptane, ethanol, tetradecane, silicone oil, water/surfactant mixtures, hexadecane, decalin.

Small sizing: The very low volume of the complete device offers the possibility of imposing rapid spatial and temporal temperature variations in the fluids transported.

Figure 9:
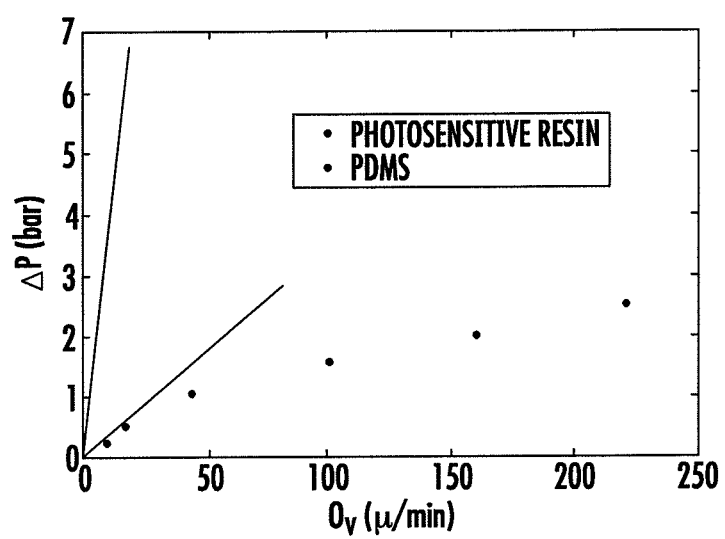

Mechanical strength: In channels of linear geometry (width 200 microns, height 50 microns) we have been able to apply pressures greater than about ten bar without impairing the devices. Moreover, the graph shown in FIG. 9 compares the performance data of two microfluidic channels, one obtained by the method of the invention and the other by standard soft-lithography processes. The hydrodynamic response is markedly improved by the absence of deformation of the channels made of photocrosslinkable resin. The mechanical strength of the photopolymerizable resins allows access to structures of small size and high aspect ratio which are difficult to obtain and/or difficult to employ under pressure in flexible elastomer devices.

Optical quality: The use of optical glue as a fabrication material, and the possibility of bonding on glass, guarantee excellent optical qualities for the devices.

Bonding in an aqueous medium: Another major plus point of the invention is associated with the possibility of constructing microfluidic devices in an aqueous medium. This possibility offers potentials which are presently inaccessible for applications in biotechnology. To illustrate this important point, we constructed cell culture chambers a few tens of microns in thickness.

The invention claimed is:

1. A method of fabricating a microfluidic device, comprising at least one step in which a stamp made of an elastomeric material is used to imprint a polymerizable and/or crosslinkable liquid composition placed on a support, a step of photoirradiation and/or of heating of the liquid composition to form a profiled base, and at least one step during which a cover is placed on the profiled base and the device including the profiled base and the cover is irradiated or treated by heating so as to seal the device.

2. The method of claim 1, wherein the liquid composition is a photopolymerizable and/or photocrosslinkable liquid resin composition.

3. The method of claim 2, wherein the photopolymerizable and/or photocrosslinkable liquid resin composition is selected from photocrosslinkable resins commonly used as adhesives, glues or surface coatings.

4. The method of claim 2, wherein the photopolymerizable and/or photocrosslinkable liquid resin composition is selected from resins based on monomers/comonomers/prepolymers of epoxy, epoxysilane, acrylate, methacrylate, acrylic acid, and methacrylic acid type, thiolene, polyurethane, and urethane-acrylate resins, and polyacrylamide gels which are liquid at ambient temperature.

5. The method of claim 1, wherein the step of photoirradiation and/or of heating of the liquid composition is conducted by photoactivation by means of irradiation with ultraviolet or visible radiation, or by heating in an oven, using hot plates, or by treatment with infrared radiation.

6. The method of claim 2, wherein the liquid resin composition is photoirradiated and/or the device is sealed by simple exposure to either natural or artificial, visible or UV radiation.

7. The method of claim 1, wherein the stamp made of elastomeric material is made of polydimethylsiloxane.

8. The method of claim 2, for fabricating a microfluidic device comprising at least one base, at least two side parts defining a channel, this method comprising at least the following steps:

i—said stamp comprises a profile complementary to that of the microfluidic device and is used as a mold, ii—a base composed of a plate made of solid material, which is capable of reacting with the photocrosslinkable and/or photopolymerizable resin composition, is placed spaced apart from the elastomer stamp, and parallel to the stamp, iii—photocrosslinkable and/or photopolymerizable resin, in liquid form and in appropriate amount, is deposited on the base, iv—the stamp is placed on the base by applying a pressure to the stamp, the liquid resin composition occupying the hollow areas (1c) of the elastomer stamp, v—the resin composition is irradiated with radiation appropriate for producing its polymerization and/or crosslinking, vi—the stamp is removed from the device.

9. The method of claim 2 for fabricating a microfluidic device comprising at least one base, at least two side parts defining a channel, this method comprising at least the following steps:

i—said stamp comprises a profile complementary to that of the microfluidic device and is used as a mold, ii—the elastomer stamp is placed on a support or on a base made of elastomer, iv—photocrosslinkable and/or photopolymerizable resin, in liquid form and in appropriate amount, is injected into the hollow areas of the stamp, onto the support or onto the base, v—the resin is irradiated with radiation appropriate for producing its polymerization and/or crosslinking, vi—the stamp is removed from the device.

10. The method of claim 8, wherein the base is placed on a support.

11. The method of claim 8 for fabricating a microfluidic device further comprising at least one base, at least two side parts defining a channel and a cover, wherein:

the irradiation in step v is metered in such a way as to leave active crosslinking and/or polymerization sites at the upper surface area of the side parts made of resin, the cover is placed in contact with the assembly composed of support, base and side parts, so as to close the device, the assembly is placed in a press and treated by irradiation so as to attach the cover to the side parts by polymerization and/or crosslinking, the assembly is withdrawn from the press.

12. The method of claim 11, wherein the in-press photopolymerization and/or photocrosslinking is performed in an aqueous medium.

13. The method of claim 1, wherein the cover is made of a material selected from the following: glass, silicon, a solid polymer film, a metal, a conducting or semiconducting alloy, a ceramic, quartz, sapphire, or an elastomer.

14. The method of claim 2 for fabricating a microfluidic device comprising a three-dimensional network of channels, comprising at least the following steps:

a plate made of elastomeric material is used as a support, a photopolymerizable and/or photocrosslinkable resin in liquid form is deposited directly on the plate, said stamp is applied to the support and resin assembly, the resin is photoirradiated so as to form the side parts of the device, forming a first pattern, the stamp is then removed, the device is obtained, comprising two side parts made of resin and a support made of elastomer, defining a pattern which is open in its upper part, the same sequence of operations is repeated so as to form the side parts of a second device, the two devices are placed one over the other, the assembly is irradiated so as to attach the two devices to one another by their side parts.

15. The method of claim 14, wherein the network is attached to a base and closed by a cover by photoirradiation of the device held under pressure.

16. The method of claim 2, for fabricating a microfluidic device made of photocrosslinkable and/or photopolymerizable resin, comprising at least the following steps:

i—said stamp comprises a profile complementary to that of the microfluidic device and is used as a mold, ii—a support composed of a plate made of solid material, which is not capable of reacting with the photocrosslinkable and/or photopolymerizable resin, is placed at a distance from the elastomer stamp, and parallel to the stamp, iii—photocrosslinkable and/or photopolymerizable resin, in liquid form and in appropriate amount, is deposited on the support, iv—the stamp is placed on the support by applying a pressure to the stamp, without the latter coming into contact with the support, v—the resin is irradiated with radiation appropriate for producing its polymerization and/or crosslinking, vi—the stamp is removed from the device.

17. The method of claim 16, wherein the support has a profile which is also imprinted in the resin.

18. The method of claim 1, comprising at least one step during which the profiled base is deposited on a temporary support made of a material which does not react with the photocrosslinkable and/or photopolymerizable resin, and then, when the definitive closing of the profiled base is desired, the base is removed from its temporary support, and the profiled base is deposited on its cover and then the assembly is irradiated, optionally with application of pressure thereto.

* * * * *